United States Patent [19]
Yamane

[11] Patent Number: 5,928,966
[45] Date of Patent: Jul. 27, 1999

[54] METHOD FOR MANUFACTURING A STACKED ELECTRODE FOR A SEMICONDUCTOR DEVICE

[75] Inventor: Tetsuya Yamane, Nagasaki, Japan

[73] Assignee: Sony Corporation, Tokyo, Japan

[21] Appl. No.: 08/864,067

[22] Filed: May 28, 1997

[30] Foreign Application Priority Data

Jun. 7, 1996 [JP] Japan ............................. P08-168308

[51] Int. Cl.$^6$ .................... H01L 21/312; H01L 21/3105; H01L 21/283
[52] U.S. Cl. ...................... 438/725; 438/963; 438/703; 438/257; 438/261; 438/593
[58] Field of Search ................... 438/257, 261, 438/265, 593, 703, 725, 963

[56] References Cited

U.S. PATENT DOCUMENTS

| | | | |
|---|---|---|---|
| 4,616,402 | 10/1986 | Mori ........................................ | 438/257 |
| 5,660,681 | 8/1997 | Fukuda et al. ........................... | 438/695 |

OTHER PUBLICATIONS

Allred, D., et al., "Film redeposition on vertical surfaces during reactive ion etching", J. Vac. Sci., 7(3), pp. 505–511. 1989.

Wolf, S. and Tauber, R.N., "Silicon Processing for the VLSI Era—vol. 1, Process Technology" (Sunset Beach CA: Lattice Press): 564–565 1986.

*Primary Examiner*—Benjamin Utech
*Assistant Examiner*—Donald L. Champagne
*Attorney, Agent, or Firm*—Hill & Simpson

[57] ABSTRACT

A method for making a stacked gate electrode structure for a semiconductor device provides for three layers of the stacked structure including a first conductive layer, an insulating layer, and a second conductive layer. The layers of the stacked structure are to be of uniform width. The method includes forming on a gate oxide layer on the surface of the semiconductor substrate a first conductive layer, an insulating layer, and a second conductive layer in order. A photoresist is formed on the second conductive layer and patterning of the second conductive layer and the insulating layer using the photoresist as an etching mask is carried out. Side wall covering layers which result from the insulating layer patterning which cover the sides of both the second conductive layer and the insulating layer are removed. Thereafter, the first conductive layer is patterned using the photoresist as an etching mask.

4 Claims, 5 Drawing Sheets

METHOD FOR MANUFACTURING A STACKED ELECTRODE FOR A SEMICONDUCTOR DEVICE

BACKGROUND OF THE INVENTION

1. Field of the Invention

The present invention relates generally to a method for making a stacked electrode for a semiconductor device and specifically to a stacked gate electrode structure for a semiconductor device.

2. Description of the Related Art

Semiconductor devices such as flash EEPROM (electrically erasable programmable read only memory) devices are provided with stacked gate electrode structures. Other semiconductor devices include stacked electrode structures as well. A typical stacked gate electrode structure includes three layers which are, for example, a first conductive layer, an insulating layer, and a second conductive layer that together are formed on a gate oxide layer at the surface of the semiconductor substrate. These layers are patterned, or shaped, to provide the stacked structure of the electrode. The formation of the stacked gate electrode structure is shown as an idealized example illustrated in FIGS. 4A through 4C.

In FIG. 4A, first, a gate oxide layer 11 is formed by well known layer forming methods on a surface of a semiconductor substrate 10 which is a silicon semiconductor substrate. Next, a first conductive layer 12 is formed on the gate oxide layer 11, followed by an insulating layer 13, and then a second conductive layer 14. The first conductive layer 12 is of a polycrystalline silicon layer that is formed by a CVD (chemical vapor deposition) method and is doped with impurities. The insulating layer 13 is formed of a material referred to as ONO by CVD methods or by oxidation methods. The ONO material is $SiO_2/SiN/SiO_2$. The second semiconductor layer 14 has a polycide structure it is formed of a polycrystalline silicon layer 14A that is formed by a CVD method and doped with impurities and a metallic-silicide layer 14B which is formed by a sputtering method. The metallic-silicide layer in one example is tungsten-silicide.

A photoresist 15 is formed on the second conductive layer 14 and then the photoresist 15 is patterned, resulting in the structure illustrated in cross section in FIG. 4A.

The FIG. 4B shows the next steps in the manufacturing process. The second conductive layer 14 is patterned using HBr as an etching gas by a RIE (reactive ion etching) method. The insulating layer 13 is patterned using $CHF_3/CF_4$ as the etching gas. The photoresist 15 which was previously patterned serves as the etching mask for these etching steps. The resulting structure is shown in the cross section of FIG. 4B.

The first conductive layer 12 is then etched, or patterned by the RIE (reactive ion etching) method using, for example, $Cl_2/HBr$ as an etching gas. The photoresist 15 also serves as the etching mask during this patterning step. Subsequently, the photoresist 15 is removed. The resulting structure is a stacked gate electrode structure such as shown in FIG. 4C in cross section. When this stacked gate electrode structure is used in a flash EEPROM semiconductor device, the patterned second conductive layer 14 serves as a control gate and the patterned first conductive layer 12 serves as a floating gate.

When the stacked gate electrode structure as shown in FIGS. 4A through 4C is intended to be formed, a side wall covering layer 20 accumulates on the sides of both the second conductive layer 14 and the insulating layer 13 when the insulating layer 13 is being patterned in the actual carrying out of the process described above. This side wall covering layer 20 is shown in FIG. 5A, and is principally formed of $CH_xF_y$ as the main ingredient. This side wall covering layer 20 is primarily formed by a reaction of the photoresist 15 or by a reaction of the carbon discharged from the material of an electrode of the dry etching apparatus reacting with the etching gas. If the patterning of the first conductive layer 12 is carried out while the side wall covering layer 20 is present then the side wall covering layer 20 functions as an etching mask as shown in FIG. 5B so that the result is the first conductive layer 12 is of a greater width than expected. Thus, the gate length is longer than the layers above it.

If the insulating layer 13 and the first conductive layer 12 are of different widths, a difference in capacitance is generated between the gate oxide layer 11 and the insulating layer 13 so that problems are caused such as that data writing to the flash EEPROM is delayed and data reading is changed. Furthermore, a problem also arises when forming the so-called gate side wall on the sides of the gate electrode. In addition, the above gate length variation causes transistor characteristics to vary.

SUMMARY OF THE INVENTION

It is an object of the present invention to provide a method for forming semiconductor devices having stacked gate electrode structures wherein three layers including a first conductive layer, an insulating layer, and a second conductive layer are formed sequentially on a gate oxide layer formed on the surface of the semiconductor substrate. According to the invention, each layer is formed of uniform width.

This and other objects and advantages of the invention are provided by a method for forming semiconductors having a stacked gate electrode structure including the steps of:

forming a first conductive layer, an insulating film, and a second conductive layer in order on a gate oxide film which is on a surface of a semiconductor substrate;

applying a photoresist on the second conductive layer and patterning the photoresist;

patterning the second conductive layer and the insulating layer using the patterned photoresist as an etching mask;

removing side wall covering layers from the sides of both the second conductive layer and the insulating layer, the side wall covering layer being formed when the insulating layer is patterned; and patterning the first conductive layer using the photoresist as an etching mask.

According to the method of the present invention, the side wall covering layer is of $CH_xF_y$ as the main ingredient and the side wall covering layer is removed by plasma etching in a gas which includes an oxygen atmosphere. This method of removing the side wall covering layer is referred as ashing. The time and conditions for the removal of the side wall covering layer is determined by carrying out various types of testing.

In the method of forming the semiconductor device of the present invention, the first conductive layer is made of a polycrystalline silicon layer, the insulating layer is comprised of a layer of material referred to as ONO ($SiO_2/SiN/SiO_2$), and the second conductive layer is of a polycide structure which includes a polycrystalline silicon layer and a metallic-silicide layer. The resulting semiconductor device may be a flash EEPROM wherein the patterned second conductive layer is applied to a control gate and the patterned first conductive layer is applied to a floating gate.

In the present invention, the side wall covering layers fixed on the sides of both the second conductive layer and the insulating layer when patterning the insulating layer are removed, for example, by an ashing method before the first conductive layer is patterned. Consequently, the first conductive layer, the insulating layer, and the second conductive layer are of uniform width. In other words, the sides of the stacked gate electrode structure are formed almost flat in the vertical direction.

As an alternative, the removal of the side wall coverings has been attempted by adding oxygen gas to the etching gas when etching the insulating layer 13. When the etching conditions are optimized, the side wall coverings are prevented from forming on both the sides of the second conductive layer 14 and on the insulating layer 13. However, controlling the generation of the side wall covering layer 20 using this approach has proved difficult and depending on etching conditions may still result in a side wall covering being deposited.

DETAILED DESCRIPTION OF THE PREFERRED EMBODIMENT

Figure 1A:
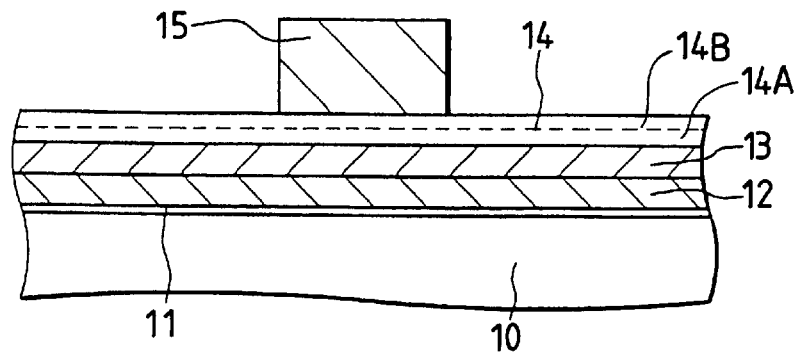
FIGS. 1A–1D are partial cross sectional views of a semiconductor substrate having overlying layers for explaining the steps in the method according to the present invention.

A preferred embodiment of the invention will now be explained with reference to the drawings. In this embodiment, a first conductive layer 12 of polycrystalline silicon, an insulating layer 13 of ONO ($SiO_2/SiN/SiO_2$), and a second conductive layer 14 of a polycide structure including a polycrystalline silicon layer 14A and a tungsten-silicide layer 14B are provided the exemplary embodiment of the present semiconductor device is a flash EEPROM, which has a patterned second conductive layer serving as a control gate and a patterned first conductive serving as a floating gate. A silicon substrate 10 is shown in FIG. 1A. In the example, an isolating region (which is not illustrated in this figure) is formed on the substrate 10 by LOCOS (local oxidation of silicon) isolation or trench isolation. Then a gate oxide layer 11 is formed on the surface of the semiconductor substrate 10 by an oxidation method. After this step, a first conductive layer 12, followed by an insulating layer 13, and then a second conductive layer 14 are formed sequentially on the gate oxide layer 11. The first conductive layer 12 is formed of a polycrystalline silicon layer which is doped with impurities and formed by a CVD (chemical vapor deposition) method. In one embodiment, the first conductive layer 12 is of a thickness of approximately 100 nm. The insulating layer 13 which is formed thereon is of a ONO material formed by CVD (chemical vapor deposition) or by an oxidation method, and preferably have a thickness of approximately 30 nm. The second conductive layer 14 is a polycide structure which has a layer portion of a polycrystalline silicon 14A with impurities which has been formed by a CVD method and a layer portion of a metal-silicide 14B, for example, a tungsten-silicide, which is formed by a sputtering method. Both the polycrystalline silicon layer and the metal-silicide layer are each approximately 100 nm in thickness. The foregoing layers are formed by methods which are well known to one of skill in this art and so a detailed explanation of the layer application methods is omitted here for the sake of brevity.

A photoresist 15 is formed on the second conductive layer 14 by, for example, a spin-coating method. After being formed, the photoresist 15 is patterned into the desired shape using photo-lithographic technology. The resulting patterned photoresist is shown in FIG. 1A in cross section. The thickness of the photoresist structure is about 1 $\mu$m.

Figure 1B:
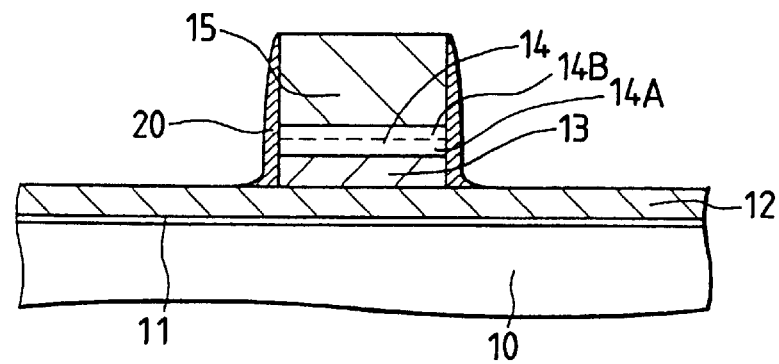

Referring to FIG. 1B, the patterned photoresist 15 is used as an etching mask for patterning the second conductive layer 14 and the insulating layer 13 by RIE (reactive ion etching) methods. For example, the second conductive layer 14 is patterned using an $HBr/Cl_2$ etching gas. The insulating layer 13 is then patterned using, for example, a $CHF_3/CF_4$ etching gas. The structure which results following these etching steps is shown in FIG. 1B in cross section. As the insulating layer is being patterned, a side wall covering layer 20 affixes itself to the side walls of the layer structure including on the second conductive layer 14 and the insulating layer 13. The side wall covering layer 20 is mainly of $CH_xF_y$.

Figure 1C:
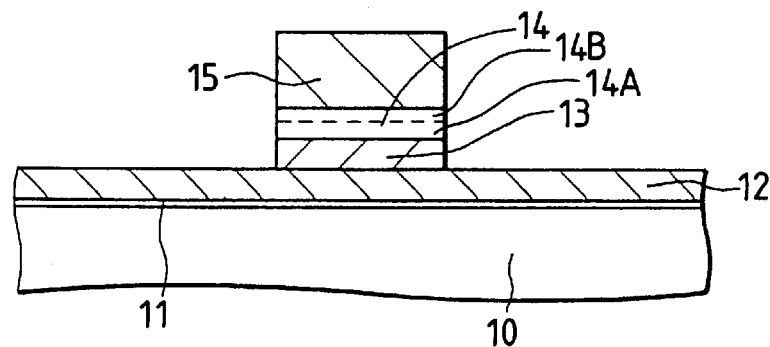
Figure 2:
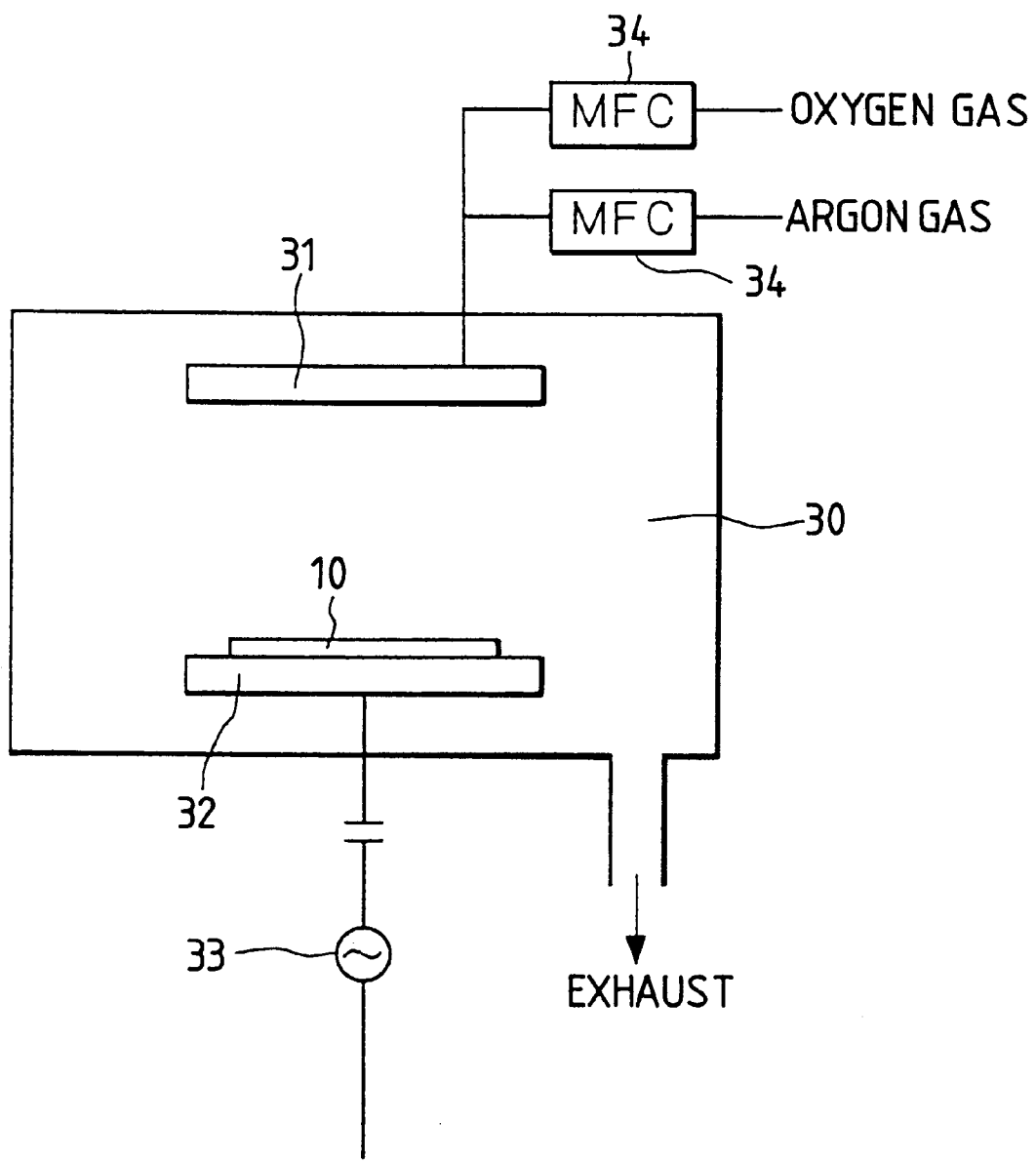
FIG. 2 is a schematic view of an ashing apparatus which is suitable for removing the side wall covering layer.

According to the present invention, after the side wall covering layer 20 is accumulated on the sides of both the second conductive layer 14 and the insulating layer 13, as the insulating layer 13 is being patterned, the side wall covering layer 20 is removed by plasma etching using oxygen gas thinned by argon gas. The result is shown in FIG. 1C. The removal of the side wall covering layer 20 is referred as ashing. Apparatus for ashing is well known, and an example is shown in FIG. 2. The ashing apparatus is provided with an upper electrode 31 and a lower electrode 32 which are arranged in an ashing chamber 30. The lower electrode 32 is electrically connected to a high frequency power supply 33. Oxygen gas and argon gas are supplied into the ashing chamber 30 through a mass flow controller 34. The semiconductor substrate 10 which has been processed to the state shown in FIG. 1B is placed on the lower electrode 32 for treatment. The argon gas and the oxygen gas are supplied into the ashing chamber 30 until the ashing chamber 30 reaches a pre-determined pressure level. Then, a high frequency electrical signal of 450 kHz or 13.56 MHZ is applied to the lower electrode 32 so that an electrical discharge occurs between the upper and lower electrodes 31 and 32. The resulting excited gases in the ashing chamber 30 remove the side wall covering layer 20.

In an exemplary embodiment, the plasma etching time was changed to 15 seconds, 30 seconds and 45 seconds, respectively. Table 1 shows the plasma etching conditions. In addition to removal of the side wall covering layer 20, some of the photoresist is removed as well. When the plasma etching time was 15 seconds, 30 seconds and 45 seconds, the amount of ashing of the photoresist 15 was 25 nm, 50 nm and 75 nm, respectively.

Figure 1D:
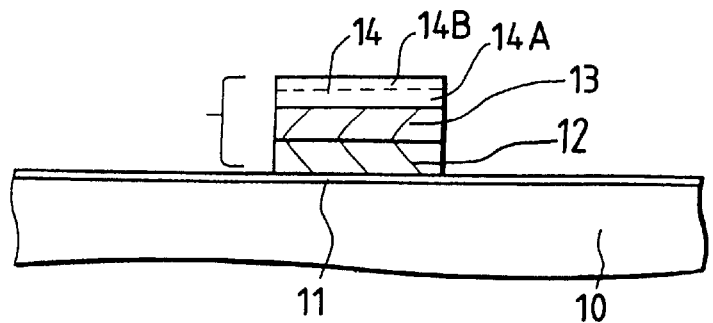

After the plasma etching phase, the natural oxide layer which is on the first conductive layer 12 is removed by dry etching using a chlorine gas, then the photoresist 15 is used as the etching mask for patterning the first conductive layer 12 by reactive ion etching (RIE) methods using an etching gas of $Cl_2$/HBr. The photoresist 15 is removed thereafter. The stacked gate electrode structure is thereby formed. FIG. 1D shows a part of a cross section of the gate electrode which has been formed in this way. Dry etching of the first conductive layer 12 should preferably be an over-etching step. The conditions for removal of the natural oxide layer, etching, and over-etching of the first conductive layer 12 according to the foregoing are shown in FIG. 1.

Following the illustrated method steps, impurities are implanted into the semiconductor substrate 10 by ion implantation methods. A gate side wall of $SiO_2$ is formed by well known methods to form an LDD (lightly doped drain) structure. Subsequently, impurities are implanted into the semiconductor substrate 10 by ion implantation methods to form a source/drain region on the semiconductor substrate 10. The source/drain region is activated by annealing. An interlayer insulating material is formed over the entire surface, thereafter, a contact plug is formed in the second conductive layer 14 and in the source/drain regions, respectively. Wiring is provided on the interlayer insulating layer to finish the manufacture of the semiconductor device.

Figure 3:
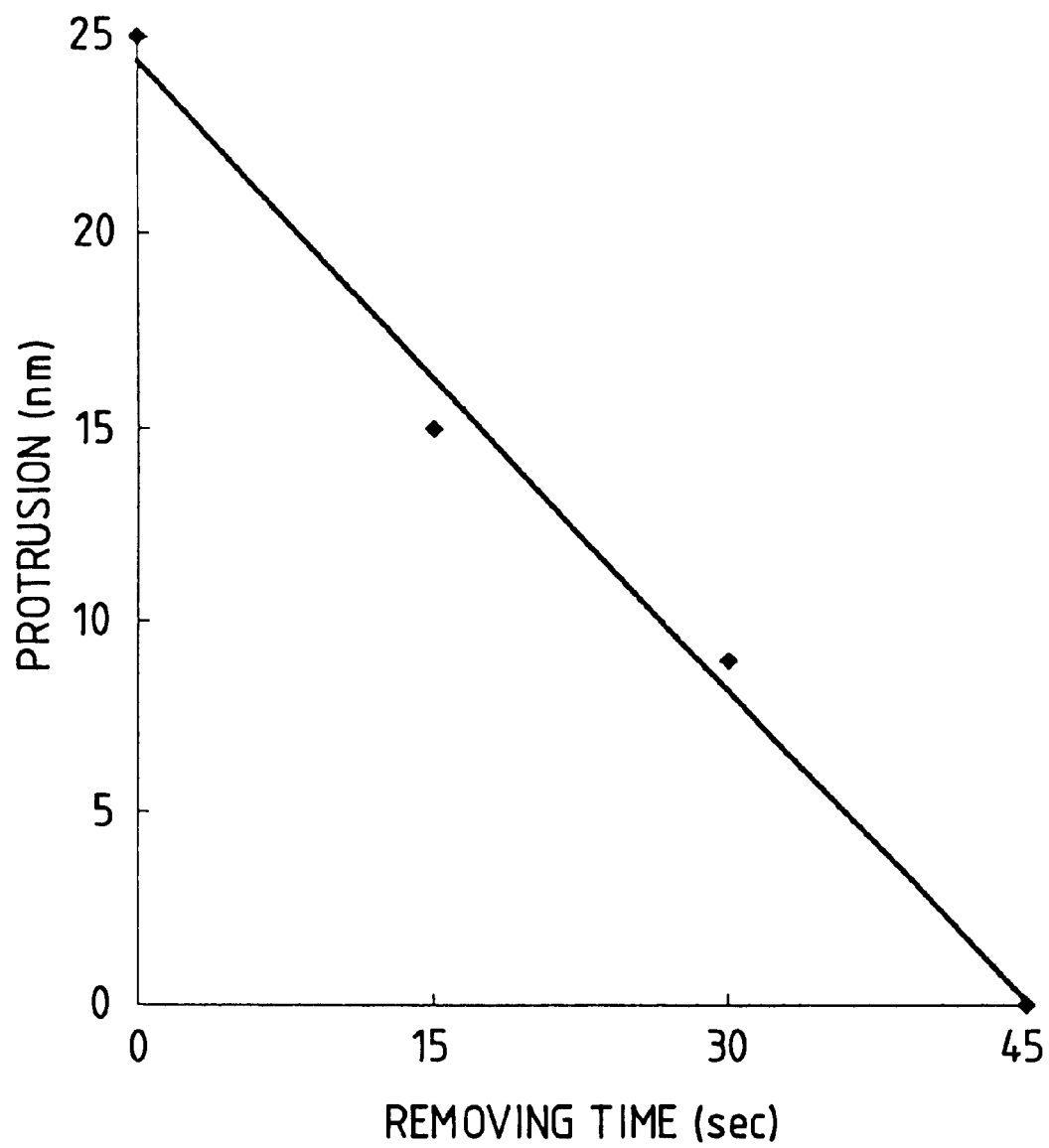
FIG. 3 is a graph which shows the relationship between the side wall covering layer removing time and the protrusion length of the first conductive layer.
Figure 4A:
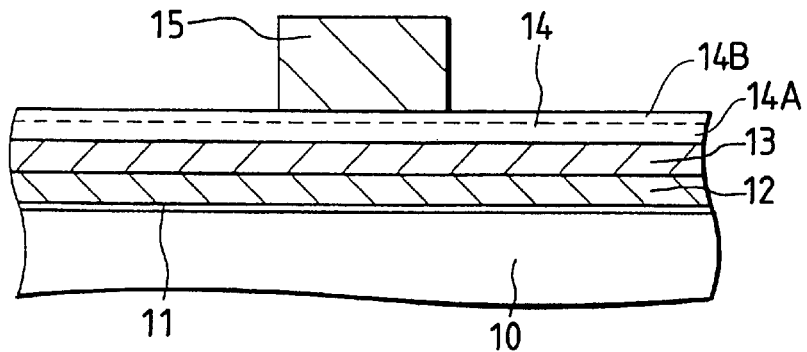
FIGS. 4A–4C are partial cross sectional views of the semiconductor substrate with overlying layers for explaining the idealized method for forming a semiconductor device with a stacked gate electrode structure.
Figure 4B:
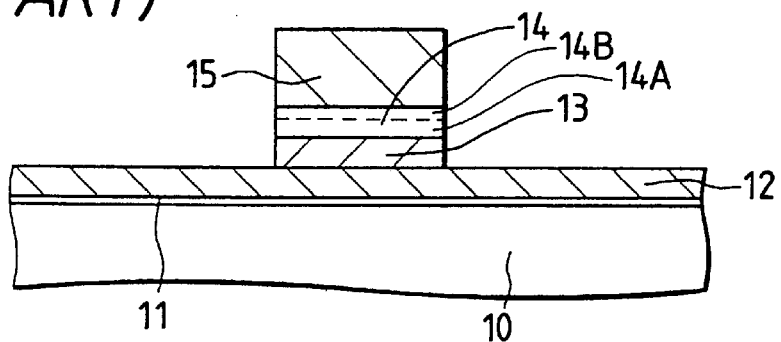
Figure 4C:
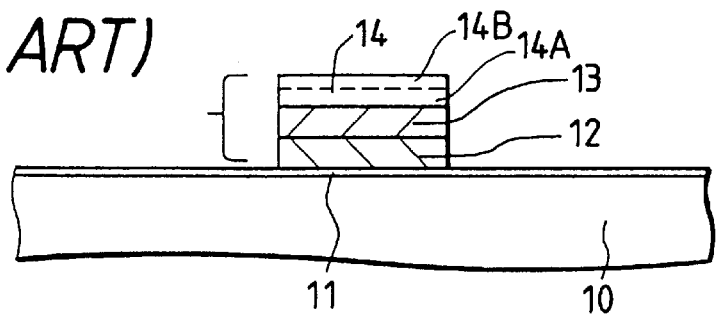
Figure 5A:
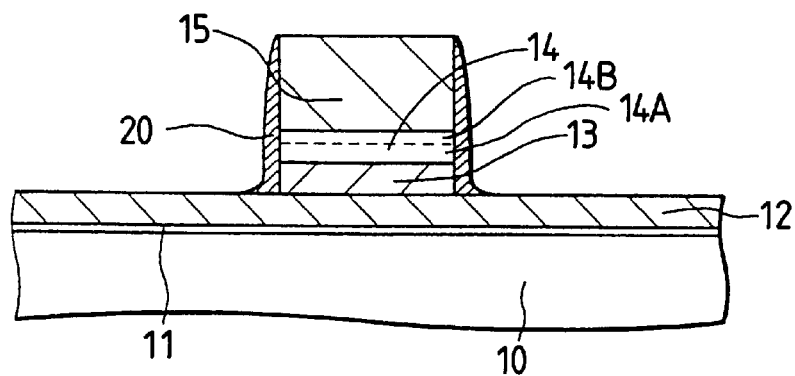
FIGS. 5A and 5B are partial cross sectional views of an actual method for forming a stacked gate electrode structure on a semiconductor device according to the known method.
Figure 5B:
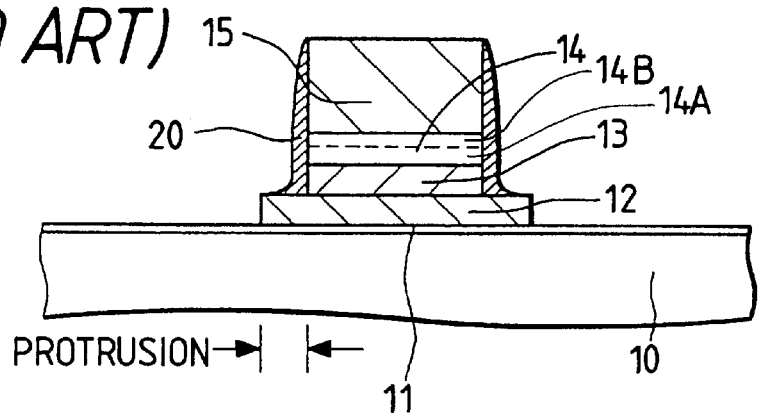

Measurements of the side wall covering layer 20 of the first conductive layer 12 which protruded from the sides of the second conductive layer 14 and the insulating layer 13 after etching were made each time the plasma etching time was changed, for example, from 15 seconds to 30 seconds and to 45 seconds, respectively. The results are shown in Table 1. A cross section photograph of the resulting gate electrode was used for this measurement. Table 1 illustrates the measurement result for the first conductive layer 12. FIG. 3 graphs out the measurement result. In FIG. 3, the horizontal axis indicates the removing time in seconds and the vertical axis indicates the protrusion value of the first conductive layer in namometers (nm), (the extent to which the first conductive layer 12 extends beyond the insulating layer 13 and the second conductive layer 14. The protrusion of the first conductive layer 12 is shown in FIG. 5B.

A comparison sample was carried out according to the following. A gate electrode for comparison was formed in the same processes as those in the foregoing embodiment except that the step of removing the side wall covering layer 20 was not carried out. The extent of protrusion of the side wall of the first conductive layer 12 was measured after the first conductive layer etching step. Table 1 and FIG. 3 shows the measured results for this sample, the removing time is shown as 0 seconds.

It will be understood from Table 1 and from FIG. 3 that the side wall covering layer 20 is removed completely when the plasma etching time is 45 seconds. This time depends on the ashing apparatus, the gas, temperature, gas concentration, and many other conditions and so may be varied as needed. In this case, the ashing apparatus as described above was used for this step. The total removal of the side wall covering layer 20 results in the sides of the stacked gate electrode structure becoming almost flat vertically.

Although this invention has been explained on the basis of an exemplary embodiment, the invention is not limited only to this embodiment. An ONO layer which is used as an insulating layer in the foregoing embodiment may be replaced by an ON($SiO_2$/SiN) layer; a three-layer structure including an SiON layer, an SiN layer, and a $SiO_2$ layer formed sequentially from the bottom; a two-layer structure including an $SiO_2$ layer and an SiN layer formed sequentially from the bottom; or a two-layer structure including a SiON layer and a SiN layer formed sequentially from the bottom. The conditions explained in the above embodiment are only examples. They may be changed as needed according to the apparatus and the process which is actually used. When the second conductive layer 14 is patterned in the etching process, a $SiO_x$ layer may be formed on the side of the second conductive layer in some cases. Preferably, a process for removing the $SiO_x$ layer using fluoric acid should be included as a step in the manufacture of such device.

In the method for making the semiconductor device according to the present invention, the side wall covering layer which is attached on both sides of the second conductive layer and the insulating layer as the insulating layer is patterned is to be removed, for example, by plasma etching in an oxygen gas atmosphere before the first conductive layer is patterned. Consequently, the first conductive layer, the insulating layer, and the second conductive layer are of uniform width. In other words, the sides of the stacked gate electrode structure are almost flat in a vertical direction. As a result, differences in width between the insulating layer and the first conductive layer are avoided and differences in capacitance between the gate oxide layer and the insulating layer are likewise avoided. Consequently, the semiconductor device manufacturing method according to this invention prevents problems such as delays in data writing into a flash EEPROM and changing of data read current. Furthermore, the method avoids the problem which arises from covering of the gate side wall which is formed on the sides of the gate electrode as well as problems that the transistor characteristic variations may be caused by variations in gate length.

Although other modifications and changes may be suggested by those skilled in the art, it is the intention of the inventor to embody within the patent warranted hereon all changes and modifications as reasonably and properly come within the scope of his contribution to the art.

TABLE 1

| Process | Removing Time (Sec.) | $O_2$ (sccm) | Ar (sccm) | $Cl_2$ (sccm) | HBr (sccm) | Pressure (Pa) | Electric Power (W) | 1st Conductive Layer Protrusion (nm) | Ashing Amount of photoresist (nm) |
|---|---|---|---|---|---|---|---|---|---|
| Side wall covering layer removal | 0 | | | | | | | 25 | |
| | 15 | 20 | 30 | | | 0.4 | 5 | 15 | 25 |
| | 30 | 20 | 30 | | | 0.4 | 5 | 9 | 50 |
| | 45 | 20 | 30 | | | 0.4 | 5 | 0 | 75 |
| Natural oxide film removal | 10 | | 50 | 10 | | 0.67 | 30 | | |

TABLE 1-continued

| Process | Removing Time (Sec.) | $O_2$ (sccm) | Ar (sccm) | $Cl_2$ (sccm) | HBr (sccm) | Pressure (Pa) | Electric Power (W) | 1st Conductive Layer Protrusion (nm) | Ashing Amount of photoresist (nm) |
|---|---|---|---|---|---|---|---|---|---|
| 1st conductive layer | 15 | | | 15 | 35 | 0.4 | 10 | | |
| 1st conductive or layer over-etching | 50 | | | 25 | 25 | 0.4 | 5 | | |

I claim:

1. A method for manufacturing a stacked gate electrode structure for a semiconductor device, comprising the steps of:

forming a first conductive layer and an insulating film and a second conductive layer in order on a gate oxide film on a surface of a semiconductor substrate;

forming a photoresist on the second conductive layer;

patterning the photoresist;

patterning the second conductive layer and the insulating layer using the photoresist which has been patterned in the foregoing step as an etching mask;

removing side wall covering layer from sides of the second conductive layer and the insulating layer, the sidewall covering layer being formed when the insulating layer is patterned; and patterning the first conductive layer using the photoresist as an etching mask.

2. The method for manufacturing a stacked gate electrode structure as claimed in claim 1, wherein the side wall covering layer is of a material including $CH_xF_y$ and wherein said step of removing includes plasma etching the side wall covering layer in an oxygen gas atmosphere.

3. The method for manufacturing a stacked gate electrode structure as claimed in claim 1, wherein the first conductive layer is a polycrystalline silicon layer, the insulating layer is an ONO layer, the conductive layer is a polycide structure including a polycrystalline silicon layer and a metallic-silicide.

4. The method for manufacturing a stacked gate electrode structure as claimed in claim 1, wherein the second conductive layer is a controlled gate and the first conductive layer is a floating gate of an EEPROM device.

* * * * *